United States Patent
Downes, Jr. et al.

(10) Patent No.: US 6,429,384 B1
(45) Date of Patent: Aug. 6, 2002

(54) CHIP C4 ASSEMBLY IMPROVEMENT USING MAGNETIC FORCE AND ADHESIVE

(75) Inventors: Francis J. Downes, Jr.; Robert M. Japp, both of Vestal; Mark V. Pierson, Binghamton, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/588,836

(22) Filed: Jun. 7, 2000

Related U.S. Application Data

(62) Division of application No. 09/458,483, filed on Dec. 9, 1999, now Pat. No. 6,142,361.

(51) Int. Cl.$^7$ .................................................. H05K 1/16
(52) U.S. Cl. ........................... 174/260; 29/744; 29/832; 174/250
(58) Field of Search ................................ 174/260, 250; 361/748, 767, 792, 793, 807, 808, 811; 29/832, 744

(56) References Cited

U.S. PATENT DOCUMENTS

| | | |
|---|---|---|
| 3,937,386 A | 2/1976 | Hartleroad et al. |
| 4,620,663 A | 11/1986 | Odashima et al. |
| 5,222,649 A | 6/1993 | Funari et al. |
| 5,447,886 A | 9/1995 | Rai |
| 5,460,320 A | 10/1995 | Belcher et al. |
| 5,479,694 A | 1/1996 | Baldwin |
| 5,632,434 A | 5/1997 | Evans et al. |
| 5,816,482 A | 10/1998 | Grabbe |
| 6,373,714 B1 * | 4/2002 | Kudoh et al. |
| 2001/0007288 A1 * | 7/2001 | Brofman et al. |

FOREIGN PATENT DOCUMENTS

RU     537770     1/1977

* cited by examiner

Primary Examiner—Kamand Cuneo
(74) Attorney, Agent, or Firm—Schmeiser, Olsen & Watts; Lawrence R. Fraley

(57) ABSTRACT

A structure that adhesively couples a chip to an organic chip carrier. The chip is attached to a top surface of the organic chip carrier by interfacing a solder bump between a C4 solder structure on the chip and a pad on a top surface of the chip carrier. The melting temperature of the solder bump is less than the melting temperature of the C4 solder structure. A block of ferrous material is on a top surface of the chip. A temporary or permanent stiffener of ferrous material is on the top surface of the chip carrier. A permanent magnet is coupled to a bottom surface of the chip carrier. Alternatively, an electromagnetic could be utilized instead of the electromagnet. Due to the permanent magnet or the electromagnet, a magnetic force on the stiffener is directed toward the magnet and substantially flattens the first surface of the chip carrier. Similarly, a magnetic force on the block is directed toward the magnet such that the electronic component and the chip carrier are held in alignment. After the solder bump has been reflowed at a temperature between the melting temperature of the solder bump and the melting temperature of the C4 solder structure, the solder bump is reconfigured. The magnetic force on the block frictionally clamps the reflowed solder between the C4 solder structure and the pad. After the chip and carrier are cooled, the C4 solder structure is adhesively and conductively coupled to the pad.

19 Claims, 6 Drawing Sheets

CHIP C4 ASSEMBLY IMPROVEMENT USING MAGNETIC FORCE AND ADHESIVE

This application is a divisional of Ser. No. 09/458,483, filed on Dec. 9, 1999 now U.S. Pat. No. 6,142,361.

BACKGROUND OF THE INVENTION

1. Technical Field

The present invention relates to a method, and associated structure, for adhesively coupling a chip to an organic chip carrier.

2. Related Art

A well-known method of adhesively coupling a chip to a chip carrier is that of controlled collapse chip connection ("C4"). With the C4 method, a C4 solder structure ("C4 structure") attached to the chip is coupled to a pad on the chip carrier by an interfacing solder bump that rests on the pad. Heating liquefies the solder bump to generate reflowed solder. Subsequent cooling of the reflowed solder effectuates an adhesive coupling between the C4 structure and the pad, which in turn mechanically and conductively couples the chip to the chip carrier.

If the chip carrier comprises a highly pliable material, such as a pliable organic material, the aforementioned C4 method is prone to failure inasmuch as the C4 structure may not properly contact the pad of the chip carrier. Such contact reliability problems result from an inability of the chip carrier to maintain flat surfaces during reflow, coupled with a difficulty of the reflowed solder to maintain contact with both the C4 structure and the pad of the chip carrier. FIGS. 7 and 8 each illustrate such contact reliability problems arising from an inability of the chip carrier to maintain flat surfaces during reflow. In FIG. 7, a chip carrier 200 is intended to be conductively coupled to a surface 250 of a substrate 240 of a chip carrier, by use of C4 structures 210, 220, and 230. Because the surface 250 has a concavity in a direction 260 away from the chip 200, C4 structures 210 and 230 are unable to maintain contact with the surface 250. In FIG. 8, a chip carrier 300 is intended to be conductively coupled to a surface 350 of a substrate 340 of a chip carrier, by use of C4 structures 310, 320, and 330. Because the surface 350 has a concavity in a direction 360 toward the chip 300, C4 structure 320 is unable to maintain contact with the surface 350.

A method is needed during reflow of the solder bump to constrain the chip carrier to have a flat structure, and to constrain the reflowed solder to maintain contact with both the C4 structure and the pad of the chip carrier.

SUMMARY OF THE INVENTION

The present method provides an electronic structure, comprising:

a substrate having an attached pad on a first surface of the substrate;

an electronic component having an attached solder structure on a first surface of the electronic component, wherein the electronic component is coupled to the substrate by a solder bump;

a stiffener coupled to the first surface of the substrate, said stiffener including a magnetic material;

a block coupled to a second surface of the electronic component, said block including a magnetic material; and a magnetic force on the stiffener and a magnetic force on the block, said magnetic force on the stiffener causing the first surface of the substrate to be substantially flattened, and said magnetic force on the block causing the electronic component and the substrate to be held in alignment.

The present method has the advantage of reliably coupling a chip to an pliable chip carrier.

The present invention has the advantage of using magnetic forces to assist in the coupling of a chip to an organic chip carrier.

The present invention has the advantage of using magnetic forces by using a permanent magnet or an electromagnet.

DETAILED DESCRIPTION OF THE INVENTION

Figure 1:
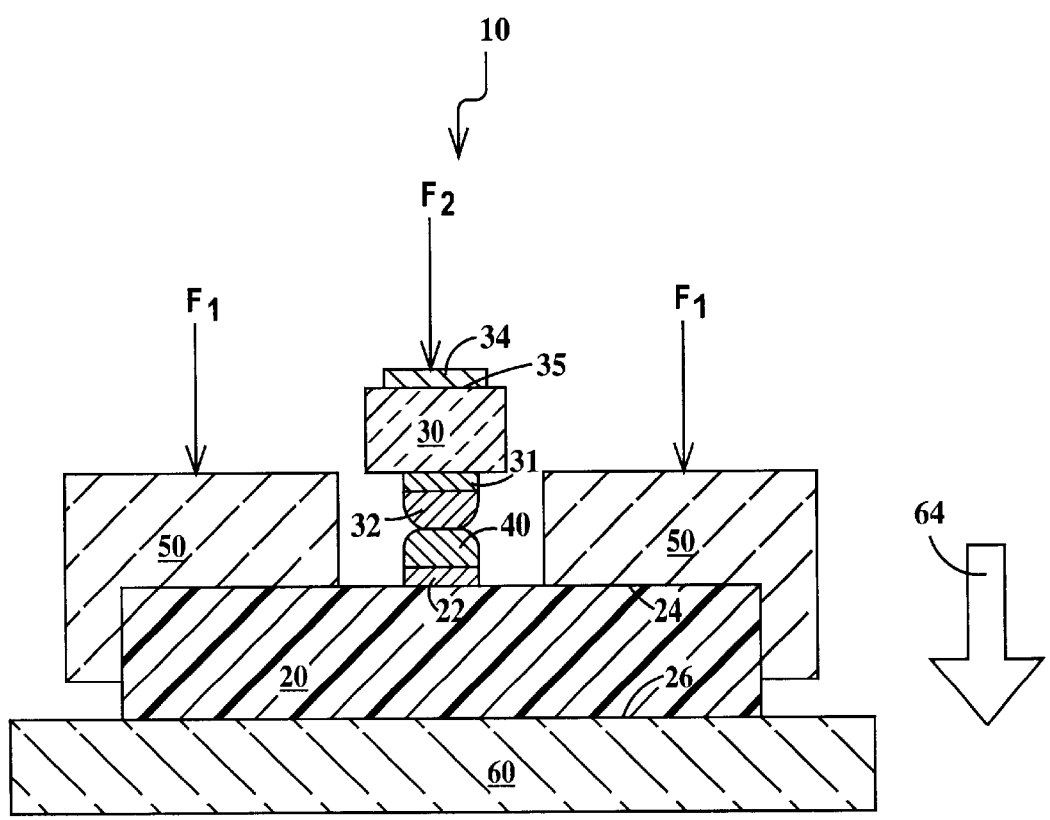
FIG. 1 depicts a front cross-section view of an electronic structure that includes a substrate, an electronic component, a temporary stiffener, and a permanent magnet, in accordance with a preferred embodiment of the present invention.

FIG. 1 illustrates a front cross-section view of an electronic structure 10, in accordance with a preferred embodiment of the present invention. The electronic structure 10 comprises a substrate 20 (e.g., a chip carrier) having a pad 22. Although the substrate 20 may comprise any material that may be used for electronic packaging, the substrate 20 is particularly advantageous for the present invention if the substrate 20 is made of a material that is very pliable and is easily deformed, such as pliable organic material, when subject to mechanical forces. The present invention mitigates the pliability of the substrate 20, inasmuch as the pliability would otherwise interfere with the reliability of adhesively coupling an electronic component, such as a chip, to the substrate 20.

In FIG. 1, an electronic component 30 (e.g., a chip) has an attached C4 structure 32 on an interfacing pad 31. The C4 structure 32, which may have any composition that is suitable for subsequent coupling of the C4 structure 32 to the pad 22, preferentially comprises an alloy of lead and till which is at least 90% lead by weight. The C4 structure 32 is an example of a solder structure that could be conductively coupled to the pad 22, and any solder structure that is capable of effectuating such conductive coupling to the pad 22 is within the scope of the present invention. A solder bump 40 has been positioned so as to couple the C4 structure 32 to the pad 22. A subsequent heating step, illustrated in FIG. 4 and discussed infra, adhesively couples the C4 structure 32 to the pad 22 by reflowing the solder bump 40. Returning to FIG. 1, the solder bump 40 should have a melting temperature that is less than a melting temperature of the C4 structure 32. For example, the solder bump 40 may include a eutectic lead-tin alloy that is 63% lead by weight and has a melting temperature of about 183° C., and the C4 structure 32 may include a lead-tin alloy that is 90% lead by weight and has a melting temperature of about 327–330° C.

A temporary stiffener 50 comprising magnetic material, such as ferrous material (e.g., steel), has been placed on a top surface 24 of the substrate 20. The temporary stiffener 50 has a characteristic of being easily removable from the substrate 20. A block 34 comprising magnetic material, such as ferrous material (e.g., steel), has been placed on the electronic component 30. While the block 34 is coupled to the electronic component 30 such that the block 34 may be easily removed subsequently, a stable positioning of the block 34 on the electronic component 30 may be enhanced by such techniques as coating the bottom surface 35 of the block 34 with a material having a high coefficient of friction such as a low durometer silicone, or by roughening the bottom surface 35. Note that a low durometer material is stiff and sticky.

A permanent magnet 60 has been placed on a bottom surface 26 of the substrate 20. The permanent magnet 60 should retain at least 80% of its permanent magnetism upon being heated to a temperature associated with the reflow step described infra in conjunction with FIG. 4. Various materials may have a sufficient permanent magnetism retention capability to be suitable for the permanent magnet 60, including alnico. The permanent magnetism of the permanent magnet 60 attracts the temporary stiffener 50, which generates a magnetic force that mechanically couples both the temporary stiffener 50 and the permanent magnet 60 to the substrate 20. The temporary stiffener 50 may be additionally coupled to the substrate 20 by resting on top of the substrate 20 as shown. Nonetheless, the temporary stiffener 50 is not adhesively coupled to the substrate 20 and may be easily removed as desired from its position on the substrate 20. The permanent magnet 60 may be additionally coupled to the substrate 20 by any method known to one skilled in the art, such as by resting the permanent magnet 60 on a fixed horizontal surface (not shown) which would sandwich the permanent magnet 60 between the fixed horizontal surface and the substrate 20.

The permanent magnet 60 generates a magnetic force $F_1$ on the temporary stiffener 50 in the direction 64. The magnetic force $F_1$ acts as a compressive force on the substrate 20, which substantially flattens the substrate 20. If the substrate 20 were to wrinkle or otherwise deform, and the magnetic force $F_1$ were absent, then the wrinkling or deformation would adversely affect a reliability of a subsequent joining of the C4 structure 32 to the pad 22 in the heating step to be described infra in conjunction with FIG. 4. Thus, an advantage of the present invention is the substantial flattening of the substrate 20 by the magnetic force $F_1$; i.e., a flattening of the substrate 20 to an extent that enables the C4 structure 32 to be reliably joined to the pad 22. To maximize its effectiveness for substantially flattening the substrate 20 near the electronic component 30, the temporary stiffener 50 should be positioned as close as possible to the electronic component 30, preferably at a maximum distance from the electronic component 30 of less than about 100 mils. Noting that a close proximity of the temporary stiffener 50 to the electronic component 30 may impede heat transfer away from the electronic component 30 during subsequent heating, the temporary stiffener 50 may have a surface structure, such as the chamfer 56 shown in FIG. 2, that assists in transferring heat away from the electronic component 30.

Returning to FIG. 1, the permanent magnet 60 generates a magnetic force $F_2$ on the block 34 in the direction 64. The magnetic force $F_2$ is transmitted to the C4 structure 32 and acts as a compressive force on the solder bump 40, which holds the electronic component 30 and the substrate 20 in alignment, generally, and particularly when the electronic structure 10 is subsequently moved to a reflow oven (e.g., the reflow oven 70 shown in FIG. 4). The magnetic force $F_2$ preferably exceeds the weight of the block 34 by a factor of at least about 5 in order to reliably hold the electronic component 30 and the substrate 20 in alignment.

Figure 4:
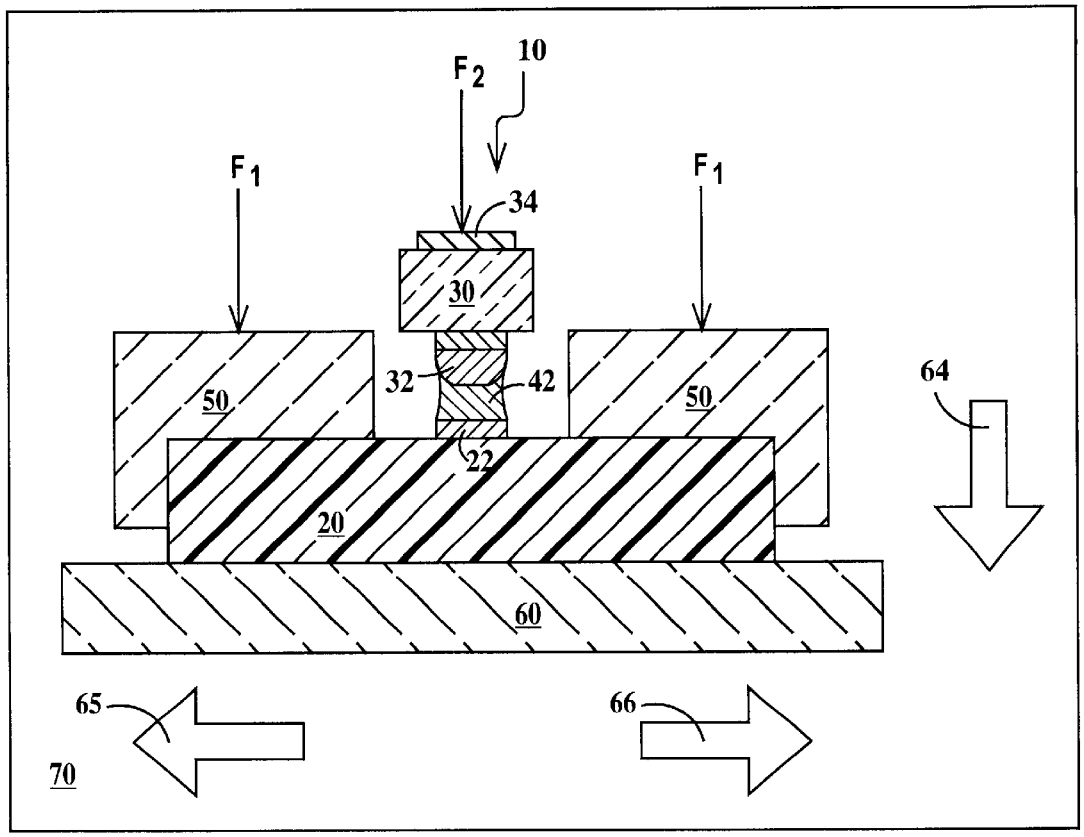
FIG. 4 depicts FIG. 1 after the electronic structure has been placed in a reflow oven.

A permanent magnetism of the permanent magnet 60, which is sufficient to generate magnetic forces $F_1$ and $F_2$ of effective magnitude for the present invention, may be determined by one of ordinary skill in the art without undue experimentation by parametrically varying the permanent magnetism; e.g., by changing permanent magnets (or changing the location of the permanent magnet 60 in relation to the temporary stiffener 50 and the block 34), and thus varying $F_1$ and $F_2$, until the substrate 20 is substantially flattened, and until the electronic component 30 and the substrate 20 are able to be reliably held in alignment such as when being moved to the reflow oven 70 shown in FIG. 4. Thus for a given location of the permanent magnet 60 in relation to the temporary stiffener 50 and the block 34, a quantity of "permanent magnetism" of the permanent magnet 60 may be expressed operationally in terms of $F_1$ and $F_2$.

If the substrate 20 includes a sufficiently thin layer of magnetic material, such as a sufficiently thin layer of Invar, then the sufficiently thin layer of magnetic material within the substrate 20 will not materially impact the magnetic forces $F_1$ and $F_2$. For example, a thin layer of Invar that is less than about 2 mils thick will not materially affect the magnetic forces $F_1$ and $F_2$. If the thin layer of magnetic material within the substrate 20 has a non-negligible effect on the magnetic forces $F_1$ and $F_2$, then the permanent magnetism should be modified to compensate for the non-negligible effect. Such compensation may be determined by one of ordinary skill in the art without undue experimentation by the same parametric variations of the permanent magnetism as was described supra.

Figure 2:
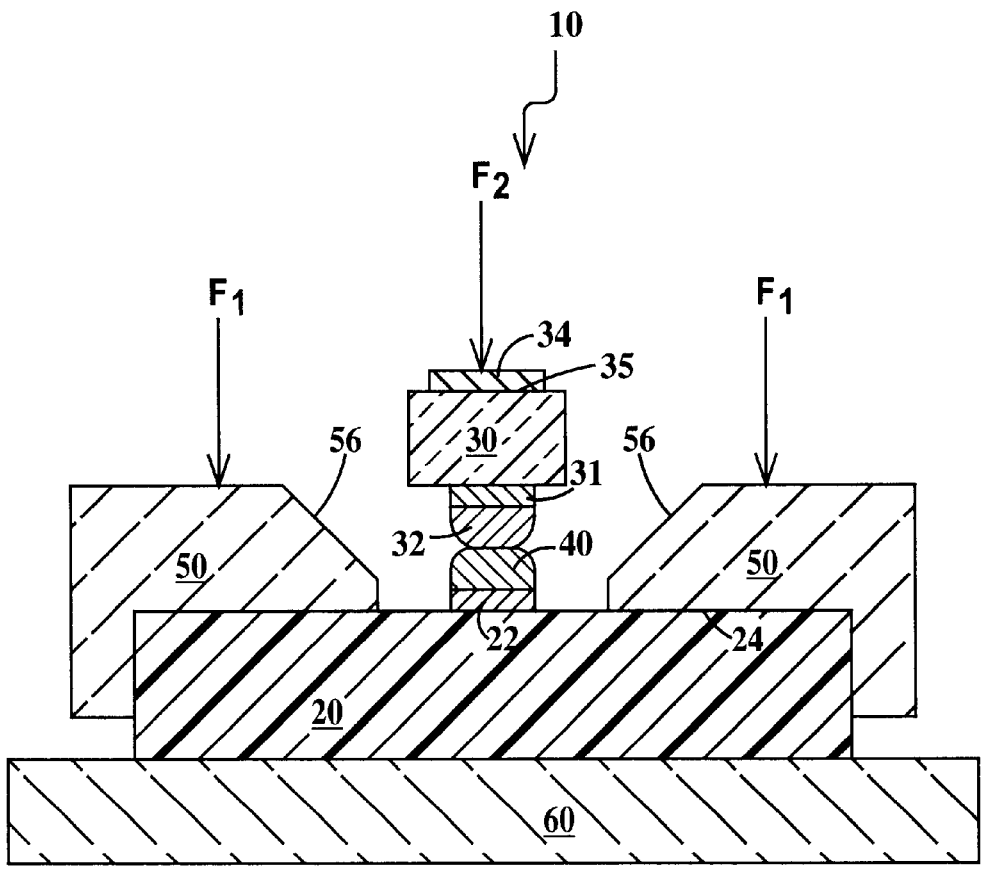
FIG. 2 depicts FIG. 1 with the temporary stiffener having a chamfer.
Figure 3:
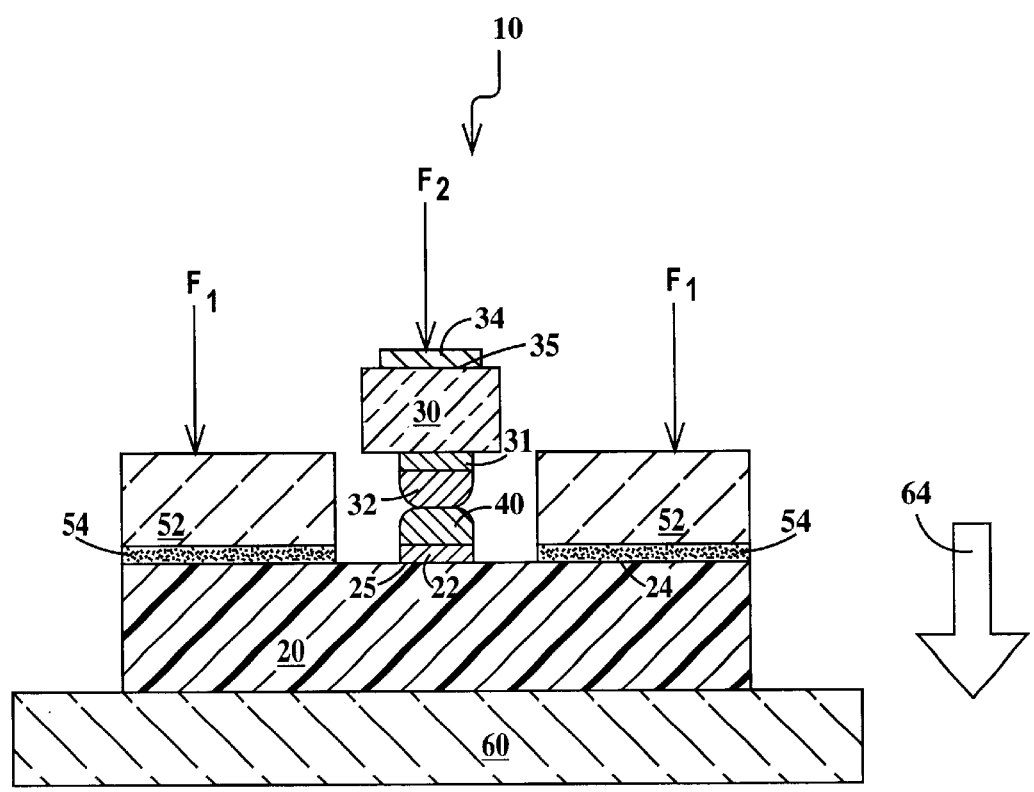
FIG. 3 depicts FIG. 1 with a permanent stiffener replacing the temporary stiffener.

FIG. 3 illustrates FIG. 1 with the temporary stiffener 50 being replaced by the permanent stiffener 52. The permanent stiffener 52 is adhesively coupled to the top surface 24 of the substrate 20 by an interfacing adhesive 54 such as a dry film of "PYRALUX" made by Du Pont De Nemours and Company. The permanent stiffener 52 cannot be removed from the substrate 20. The permanent stiffener 52 enables a manufacturer or distributor of the substrate 20 to transfer the substrate 20 to another party, such as a purchaser of the substrate 20, who may subsequently couple the electronic component 30 to the substrate 20, in accordance with the present invention, without having to handle the substrate 20 in its pliable or highly deformable state. This use of the permanent stiffener 52 recognizes that many purchasers of pliable organic chip carriers prefer not to handle the organic chip carrier in its pliable or highly deformable state. Note that during subsequent heating or cooling steps, a difference in coefficient of thermal expansion (CTE) of the permanent stiffener 52 and the substrate 20, in combination with the softness of the substrate 20 relative to the hardness of the permanent stiffener 52, may cause the substrate 20 to bow in the portion 25 of the top surface 24 that is nearest the electronic component 30. This potentiality of bowing is substantially mitigated, however, by a capability of the permanent stiffener 52, in combination with the permanent magnet 60, to substantially flatten the substrate 20. The capability of the permanent stiffener 52 to substantially flatten the substrate 20 is similar to that of the temporary stiffener 50 as described supra in relation to FIG. 1. While some bowing of the substrate 20 may occur when the permanent stiffener 52 of FIG. 3 is used, the bowing will be mitigated by the substantial flattening of the substrate 20 such that the present invention will work properly for its intended purpose. Note that a surface structure that assists in a transfer of heat away from the electronic component 30 may be formed on the permanent stiffener 52. For example, a chamfer may be formed on the permanent stiffener 52 in the same manner that the chamfer 56 of FIG. 2 was formed on the temporary stiffener 50.

Returning to FIG. 1, the electronic component 30 may be adhesively coupled to the substrate 20 by reflowing the solder bump 40, using any heating technique known to one of ordinary skill in the art. For example, the electronic structure 10 may be moved to a reflow oven and the reflow oven may be heated to reflow the solder bump 40. FIG. 4 illustrates FIG. 1 after the electronic structure 10 has been placed in a reflow oven 70 after which the solder bump 40 is reflowed to become the reflowed solder 42. For reflowing purposes, the reflow oven 70 should be heated to a temperature T that: exceeds the melting temperature of the solder bump 40, is less than the melting temperature of the C4 structure 32, and is less than a temperature that would damage any substance "married" to the substrate 20. A substance is "married" to the substrate 20 if the substance is within or on the substrate 20. For example, a temperature that would not damage a solder mask placed exterior to the substrate 20 is about 220° C. The preceding limitations on the temperature T during reflow insures that T will be high enough to reflow the solder bump 40 and low enough both leave the C4 structure 32 solid and not damage either the substrate 20 or structure on or near the substrate 20. If the solder bump 40 comprises eutectic lead/tin and the C4 structure 32 comprises 90/10 lead/tin by weight, then T should be above about 183° C. and preferably below about 220° C. The reflow oven 70 may be heated to the temperature T either before or after the electronic structure 10 has been placed in the reflow oven 70. The electronic structure 10 should be in the reflow oven 70 at the temperature T for a period of time t sufficient for the reflowed solder 42 to be formed with a shape and a spatial distribution that will enable the electronic component 30 to be become adhesively and conductively coupled to the substrate 20 as the electronic structure 10 is subsequently cooled. A representative range for t is, inter alia, about 5 minutes to about 30 minutes.

As stated supra in the discussion accompanying FIG. 1, the force $F_1$ generated by the permanent magnet 60 on the temporary stiffener 50, substantially flattens the substrate 20. Additionally, the force $F_2$ in FIG. 4, which is generated by the permanent magnet 60 on the block 34, effectuates a compressive force on the C4 structure 32, which causes the reflowed solder 42 to be frictionally clamped between the C4 structure 32 and the pad 22. Due to poor adhesion between the reflowed solder 42 and the substrate 20, and without the aforementioned frictional clamping, the reflowed solder 42 would have a tendency to move laterally in a direction 65 or 66 (see FIG. 4), which would potentially prevent the C4 structure 32 and the pad 22 from being mechanically and conductively coupled by the reflowed solder 42. Thus, the magnetic force $F_2$ facilitates reliable mechanical and conductive coupling between the electronic component 30 and the substrate 20. Note that the permanent stiffener 52 of FIG. 3 may be used in place of the temporary stiffener 50 in the reflow oven 70 of FIG. 4. Additionally, the temporary stiffener 50 in FIG. 4 may be chamfered as shown in FIG. 2 for the chamfer 56, or otherwise surface structured, to improve heat transfer away from the electronic component 30 during the reflow step associated with FIG. 4.

Figure 5:
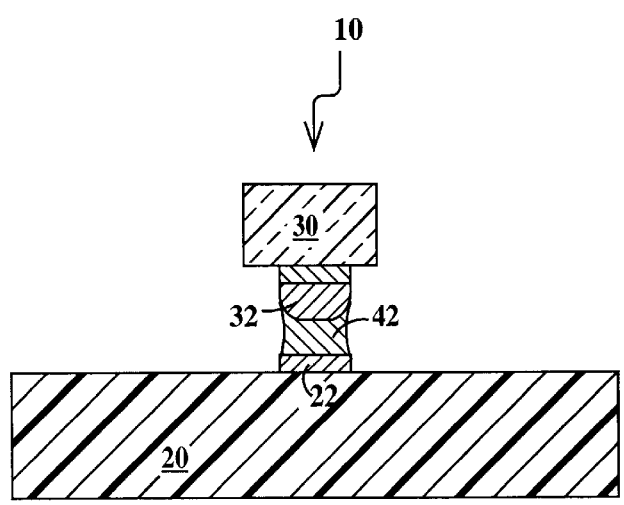
FIG. 5 depicts FIG. 4 after the electronic structure has been removed from the reflow oven.

After the reflowed solder 42 has been sufficiently formed as explained supra, the electronic structure 10 is cooled down to ambient temperature in any practical manner such by being removed from the reflow oven 70. Another method of cooling the electronic structure 10 includes allowing the electronic structure 10 to cool off while still in the reflow oven after being decoupled from the reflow oven's heat source, such as by being placed in a cooling station within the reflow oven. The final temperature to which the electronic structure 10 is cooled may be ambient temperature or less. FIG. 5 illustrates the electronic component 30 adhesively coupled to the substrate 20 after the electronic structure 10 has been removed from the reflow oven 70, after the electronic structure 10 has cooled down to ambient temperature, and after the permanent magnet 60, the temporary stiffener 50, and the block 34 have been removed from the substrate 20.

Figure 6:
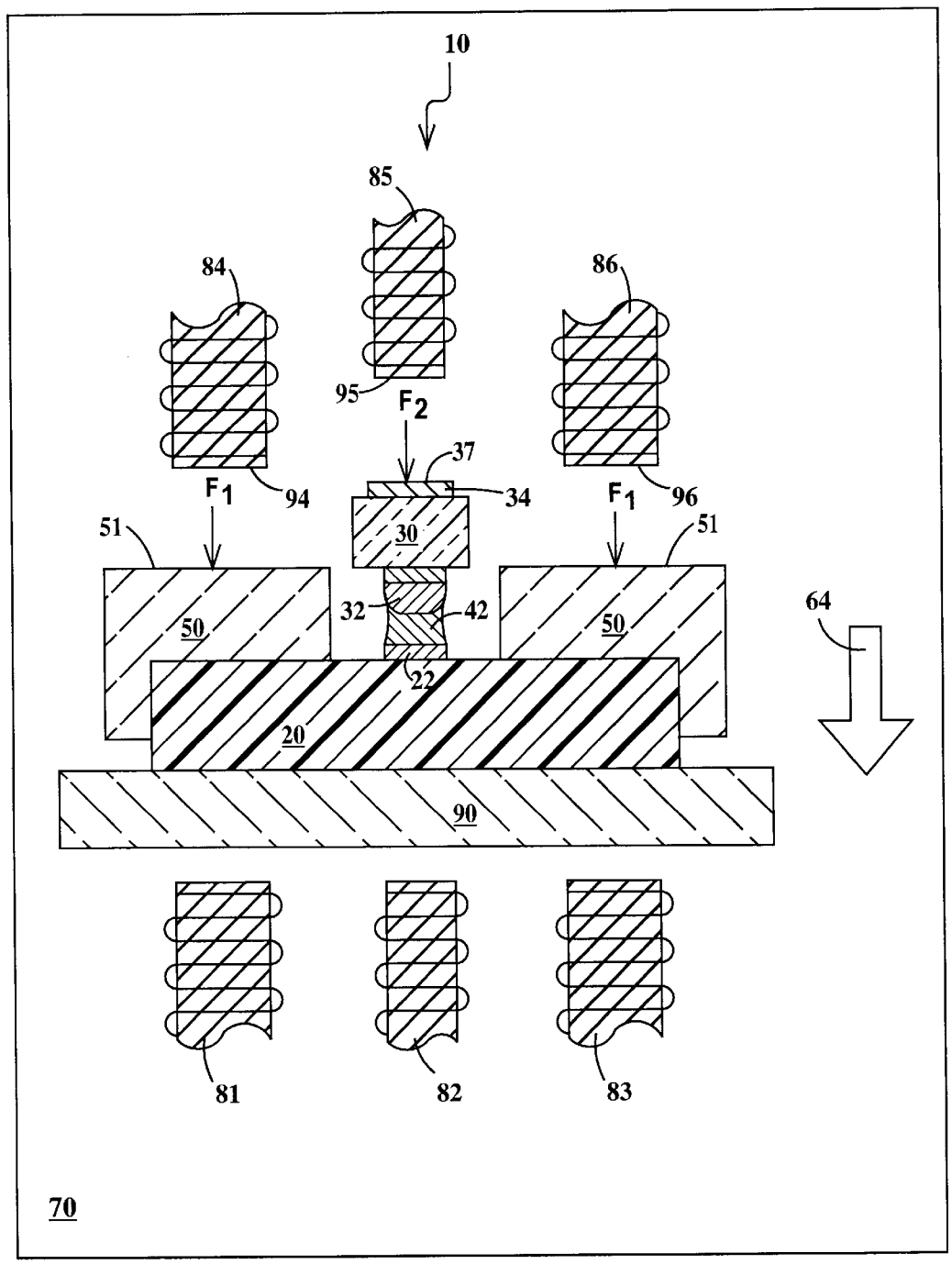
FIG. 6 depicts FIG. 4 with an electromagnet replacing the permanent magnet.
Figure 7:
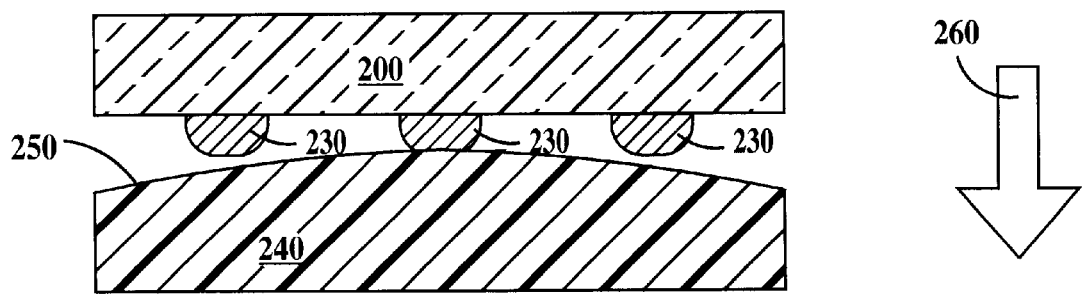
FIG. 7 depicts a chip carrier interfacing a substrate having surface concavity away from the chip carrier.
Figure 8:
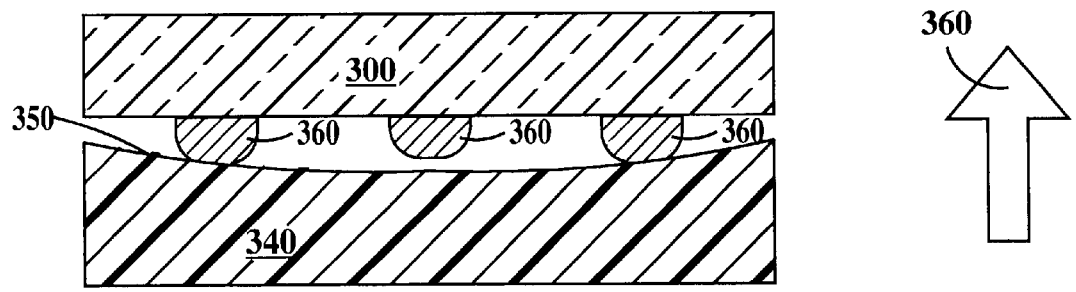
FIG. 8 depicts a chip carrier interfacing a substrate having surface concavity toward the chip the chip carrier.

While the preceding FIGS. 1–4 utilized the permanent magnet 60, the present invention could work for its intended purpose with an electromagnet replacing the permanent magnet 60. FIG. 6 illustrates the electronic structure 10 in the reflow oven of FIG. 4 with an electromagnet replacing the permanent magnet 60. In FIG. 6, although the entire electromagnet is not shown, illustrative electromagnet segments 81, 82, 83 (or alternatively 84, 85, and 86) of the electromagnet are shown. Many different electromagnet embodiments may be used as may be designed without undue experimentation by one of ordinary skill in the design of electromagnet circuits. The aforementioned electromagnet segments 81, 82, 83 (or alternatively 84, 85, and 86) are merely illustrative and do not dictate the number, geometry, or positioning of electromagnet segments of an electromagnet circuit that may be employed with the present invention. If the electromagnet segments 81, 82, and 83 are used, the electromagnet segments 81, 82, and 83 induce an attractive magnetic force on both the temporary stiffener 50 and the block 34 in the direction 64. If the electromagnet segments 84, 85, and 86 are used, then the temporary stiffener 50 and the block 34 must have permanent magnetism rather than merely having magnetic a material. Additionally, the surfaces 94, 95, and 96 of the electromagnet segments 84, 85, and 86, respectively, must have the same magnetic polarity (i.e., north polarity or south polarity) as the surface 51 of the temporary stiffener 50 and the surface 37 of the block 34, in order that there be a repulsive magnetic force in the direction 64 on both the temporary stiffener 50 and the block 34.

As was described supra for FIGS. 1 and 4, the permanent magnet 60 provides a supporting surface for substantially flattening the substrate 20 between the temporary stiffener 50 and the permanent magnet 60. Likewise, the use of electromagnet segments in FIG. 6 shows a fixed supporting structure 90 that replaces the mechanical support function of the permanent magnet 60 for substantially flattening the substrate 20 between the temporary stiffener 50 and the fixed supporting structure 90. Note that the permanent stiffener 52 of FIG. 3 may be used in place of the temporary stiffener 50 in FIG. 6. Additionally, the temporary stiffener 50 in FIG. 6 may be chamfered as shown in FIG. 2 for the chamfer 56, or otherwise surface structured, to improve heat transfer away from the electronic component 30 during the reflow step associated with FIG. 4.

An advantage of an electromagnet circuit over the permanent magnet 60 is that the permanent magnet 60 is not needed and an electromagnet circuit may be fixed in place in the reflow oven 70 and operated by merely flicking a switch that turns on or off an electric current which passes through the coils of the electromagnet. In contrast, the permanent magnet 60 must be mechanically affixed to the substrate 20 with each implementation of the present invention. On the other hand, the permanent magnet 60 may be simpler than an electromagnet and more time may consequently be required to properly design an electromagnet circuit than to choose the permanent magnet 60. Another advantage an electromagnet circuit is that with the electromagnet segments 81, 82, and 83, only unmagnetized magnetic material is required (i.e., the unmagnetized magnetic material of both the temporary stiffener 50 and the block 34) and no permanent magnetism is required.

The preceding discussions of FIGS. 1, 2, 3, 4, and 6 illustrate magnetic systems for generating a magnetic force $F_1$ on the temporary stiffener 50 (or the permanent stiffener 52) and a magnetic force $F_2$ on the block 34. FIGS. 1, 2, 3, and 4 illustrate a magnetic system in the form of the permanent magnet 60. FIG. 6 illustrates another magnetic system in the form of an electromagnet.

While preferred and particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

We claim:

1. An electronic structure, comprising:
   a substrate having an attached pad on a first surface of the substrate;
   an electronic component having an attached solder structure on a first surface of the electronic component, wherein the electronic component is coupled to the substrate by a solder bump;
   a stiffener coupled to the first surface of the substrate, said stiffener including a magnetic material;
   a block coupled to a second surface of the electronic component, said block including a magnetic material; and
   a magnetic force on the stiffener and a magnetic force on the block, said magnetic force on the stiffener causing the first surface of the substrate to be substantially flattened, and said magnetic force on the block causing the electronic component and the substrate to be held in alignment.

2. The electronic structure of claim 1, further comprising a permanent magnet coupled to a second surface of the substrate, wherein the permanent magnet is generating the magnetic force on the stiffener and the magnetic force on the block.

3. The electronic structure of claim 2, wherein a permanent magnetism of the permanent magnet at a temperature of about 220° C. is at least about 80% of a permanent magnetism of the permanent magnet at ambient temperature.

4. The electronic structure of claim 2, wherein the permanent magnet includes alnico.

5. The electronic structure of claim 1, further comprising an electromagnet, wherein the electromagnet is generating the magnetic force on the stiffener and the magnetic force on the block.

6. The electronic structure of claim 1, wherein the magnetic material of the stiffener is permanently magnetized, and wherein the magnetic material of the block is permanently magnetized.

7. The electronic structure of claim 1, wherein the magnetic material of the stiffener is not permanently magnetized, and wherein the magnetic material of the block is not permanently magnetized.

8. The electronic structure of claim 1, wherein the solder bump is at ambient temperature.

9. The electronic structure of claim 1, wherein the solder bump is in a reflow state at a temperature T above a melting temperature of the solder bump and below a melting temperature of the solder structure.

10. The electronic structure of claim 1, wherein the stiffener is a temporary stiffener.

11. The electronic structure of claim 1, wherein the stiffener is a permanent stiffener.

12. The electronic structure of claim 1, wherein the substrate is an organic chip carrier and the electronic component is a chip.

13. The electronic structure of claim 1, wherein the magnetic material of the block includes a ferrous material.

14. The electronic structure of claim 1, wherein the magnetic material of the stiffener includes a ferrous material.

15. The electronic structure of claim 1, wherein a maximum separation of the stiffener from the electronic component is less than about 100 mils.

16. The electronic structure of claim 1, wherein the stiffener comprises a surface structure for improving a transfer of heat away from the electronic component.

17. The electronic structure of claim 16, wherein the surface structure includes a chamfer.

18. The electronic structure of claim 1, wherein the solder bump comprises a eutectic mixture of lead and tin, and wherein the solder structure includes a mixture of lead and tin in a lead/tin ratio by weight of at least about 9.

19. The electronic structure of claim 1, wherein the solder structure includes a C4 structure.

* * * * *